US012787579B2

(12) United States Patent
Kim et al.

(10) Patent No.: US 12,787,579 B2
(45) Date of Patent: Nov. 3, 2026

(54) DISPLAY DEVICE USING LIGHT EMITTING DIODES

(71) Applicant: LG ELECTRONICS INC., Seoul (KR)

(72) Inventors: Jinyeol Kim, Seoul (KR); Namjoo Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 364 days.

(21) Appl. No.: 18/634,797

(22) Filed: Apr. 12, 2024

(65) Prior Publication Data

US 2025/0255121 A1 Aug. 7, 2025

(30) Foreign Application Priority Data

Feb. 2, 2024 (KR) ........................ 10-2024-0016875

(51) Int. Cl.
*H10K 59/131* (2023.01)
*H10K 59/35* (2023.01)
*H10K 59/80* (2023.01)

(52) U.S. Cl.
CPC ........... *H10K 59/131* (2023.02); *H10K 59/35* (2023.02); *H10K 59/805* (2023.02)

(58) Field of Classification Search
CPC .... H10K 59/131; H10K 59/35; H10K 59/805; H10W 90/00; H10D 86/441; H10H 20/857; H10H 29/142
See application file for complete search history.

(56) References Cited

U.S. PATENT DOCUMENTS

2018/0374828 A1* 12/2018 Liao ........................ H10D 86/40

FOREIGN PATENT DOCUMENTS

KR 1020210099112 8/2021
KR 10202301687175 12/2023

OTHER PUBLICATIONS

Korean Intellectual Property Office Application No. 10-2024-0016875, Office Action dated Apr. 21, 2025, 6 pages.

* cited by examiner

*Primary Examiner* — David Vu
(74) *Attorney, Agent, or Firm* — LEE, HONG, DEGERMAN, KANG & WAIMEY

(57) ABSTRACT

A display device is applicable to a display-related technical field, and a display device using micro light emitting diodes (LED) are disclosed. The display device using light emitting diodes includes a wiring substrate in which a plurality of unit pixels is defined, a first wiring electrode and a second wiring electrode arranged on the wiring substrate, a first electrode pad and a second electrode pad respectively connected to the first wiring electrode and the second wiring electrode, and at least one light emitting diode electrically connected to the first electrode pad and the second electrode pad in each unit pixel region to form a subpixel.

15 Claims, 15 Drawing Sheets

(A)

(B)

(C)

DISPLAY DEVICE USING LIGHT EMITTING DIODES

CROSS-REFERENCE TO RELATED APPLICATION(S)

Pursuant to 35 U.S.C. § 119, this application claims the benefit of earlier filing date and right of priority to Korean Application No(s). 10-2024-0016875, filed on Feb. 2, 2024, the contents of which are all incorporated by reference herein in its entirety.

BACKGROUND OF THE DISCLOSURE

Field of the Disclosure

The present disclosure is applicable to a display device-related technical field, and relates to, for example, a display device using a micro light emitting diode (LED).

Discussion of the Related Art

Recently, display devices with excellent characteristics such as thinness and flexibility are being developed in a field of display technology. Currently, commercially available major displays are represented by a liquid crystal display (LCD) and an organic light emitting diode (OLED).

In one example, a light emitting diode (LED), as a well-known semiconductor light emitting diode that converts current into light, has been used as a light source for an image displayed in electronic devices including an information and communication device along with a GaP:N-based green LED, starting with commercialization of a red LED using a GaAsP compound semiconductor in 1962.

Recently, such light emitting diode (LED) has been gradually miniaturized and manufactured as a micrometer-sized LED to be used for pixels or flat lighting of the display device.

Sapphire, which is used as a substrate on which a gallium nitride-based semiconductor is grown, has a tilted crystal surface. For example, an R-plane has a crystal surface tilted along a m-axis. The ordinary sapphire may have the R-plane as a growth plane. Because the R-plane has a surface tilted with respect to a hexagonal prism crystal shape, the sapphire substrate and the gallium nitride-based semiconductor grown on the crystal surface of the sapphire substrate may have such a tilt angle.

In addition, such a tilt angle may also be formed as a light emitting diode is formed as the gallium nitride-based semiconductor on the sapphire substrate and then is cut in a direction of the crystal surface of the sapphire substrate.

Accordingly, when the light emitting diode is mounted on a wiring substrate in a general arrangement and emits light, an individual sub-pixel may be constructed in a state having an asymmetrical light distribution with respect to a direction for connecting two electrode pads with respect to one light emitting diode and the individual sub-pixels may constitute the display device.

As such, when the display device is formed with the individual sub-pixels with the asymmetrical light distribution, a problem in that, when viewing the display device from the outside, a color of a display appears differently depending on a viewing direction may occur.

As displays using light emitting diodes such as LEDs have been developed, the demand for displays with a narrow pitch (i.e., a distance between LED light sources) is increasing. In order to implement narrow-pitch displays, high-density design technology for LED light sources is required, and accordingly, a printed circuit board (PCB) constituting a wiring substrate tends to be designed and implemented in multiple layers.

In such a multilayer wiring substrate, electrical connection between multiple layers can be made through via holes. At this time, the via holes may be located to overlap a pad region in which LED light sources are located (transferred).

If the via holes are spaced apart from each other by a certain distance on the pad, the shape and width of the pad may not be affected by the via holes. However, due to a high level of image quality expected as described above, as the pitch becomes narrower, a spatial margin for positioning the via hole farther away from the pad becomes reduced in size. Accordingly, the phenomenon in which the via holes overlap the pad may occur.

For example, the pad connected to a common electrode can be connected using a single via hole, but the pad connected to a pixel electrode must be connected to RGB LEDs that make up each subpixel, so that the density of via holes for the common electrode and the density of via holes for the pixel electrode may be different from each other. For example, the density of via holes connected to the pixel electrode increases by approximately three times or more. Accordingly, the probability that one or more via holes will overlap the pad may increase.

When the via hole overlaps the pad, the shape and area of the pad connected to a negative (−) electrode and the other pad connected to a positive (+) electrode may be formed differently depending on the density of via holes.

Accordingly, when applying solder for transferring (bonding) the LEDs on the pad, the amount of solder may vary. Therefore, the amount of solder on both pads may vary. This may result in a difference in solder height. Accordingly, the left and right heights of the LEDs may vary, and the LEDs may be inclined to one side without being flat and then transferred to the pad. In this way, when the LEDs are tilted and transferred, the direction of light emission from the LEDs is changed and the intensity of light changes depending on a viewing angle, which may cause abnormal points in image quality.

Therefore, there is a demand for a method capable of solving such problem.

SUMMARY OF THE DISCLOSURE

Accordingly, embodiments of the present disclosure are directed to a display device using light emitting diodes (LEDs) that substantially obviate one or more problems due to limitations and disadvantages of the related art.

An object of the present disclosure is to provide a display device using light emitting diodes (LEDs) that can offset biased light distribution of each light emitting diode (LED) affected by crystallinity of such LEDs.

Another object of the present disclosure is to provide a display device using LEDs that can solve a problem of colors appearing differently depending on a viewing direction when the display device is viewed from the outside.

Another object of the present disclosure is to provide a display device using LEDs that can reduce parasitic capacitance arising from a difference in electrical polarity between the LEDs.

Another object of the present disclosure is to provide a display device using LEDs that can offset an electric field arising from a difference in electrical polarity between the LEDs.

Another object of the present disclosure is to provide a display device using LEDs that can correct a difference in color between the left and right sides of the display by visually reinforcing some areas with weak colors when viewing the display from one direction.

Another object of the present disclosure is to provide a display device using LEDs that can reduce the number of via holes.

Accordingly, the present disclosure provides a display device using LEDs that can increase the freedom of pixel arrangement and is not affected by via holes in high-density pixel arrangement depending upon the increasing resolution.

Technical tasks obtainable from the present disclosure are non-limited by the above-mentioned technical tasks. And, other unmentioned technical tasks can be clearly understood from the following description by those having ordinary skill in the technical field to which the present disclosure pertains.

Additional advantages, objects, and features of the disclosure will be set forth in the disclosure herein as well as the accompanying drawings. Such aspects may also be appreciated by those skilled in the art based on the disclosure herein.

To achieve these objects and other advantages and in accordance with the purpose of the disclosure, as embodied and broadly described herein, a display device using light emitting diodes may include a wiring substrate in which a plurality of unit pixels is defined, a first wiring electrode and a second wiring electrode arranged on the wiring substrate, a first electrode pad and a second electrode pad respectively connected to the first wiring electrode and the second wiring electrode, and at least one light emitting diode electrically connected to the first electrode pad and the second electrode pad in each unit pixel region to form a subpixel. The light emitting diode includes a first light emitting diode disposed in a first pixel region and installed with a first arrangement; and a second light emitting diode disposed in a second pixel region adjacent to the first pixel region and installed with a second arrangement that is symmetrical to the first arrangement. The second wiring electrode is disposed on the same layer as the light emitting diode.

In an exemplary embodiment, the first wiring electrode may be disposed on a different layer from the light emitting diode through at least one via hole connected to the first electrode pad.

In an exemplary embodiment, the first electrode pad may include at least one pad extension portion.

In an exemplary embodiment, the pad extension portion may include: a first extension portion; and a second extension portion extending farther than the first extension portion.

In an exemplary embodiment, the via hole may be formed in the pad extension portion.

In an exemplary embodiment, the pad extension portions may be connected to each other in pixel regions adjacent to each other.

In an exemplary embodiment, the pad extension portions may be connected to each other in pixel regions facing each other.

In an exemplary embodiment, for the pad extension portions connected to each other, the via hole may be shared by the first pixel region and the second pixel region.

In an exemplary embodiment, the first arrangement and the second arrangement may be configured such that positions of electrodes of the first light emitting diode and the second light emitting diode are symmetrical to each other.

In an exemplary embodiment, the second wiring electrode corresponding to the first pixel region and an adjacent second wiring electrode corresponding to the second pixel region may be arranged symmetrically with respect to a central portion between the first pixel region and the second pixel region.

In an exemplary embodiment, the first pixel region and the second pixel region may be paired between the second wiring electrodes adjacent to each other.

In an exemplary embodiment, the first light emitting diode and the second light emitting diode may be configured to emit light of the same color.

In an exemplary embodiment, a plurality of first pixel regions may be arranged along the second wiring electrode.

In an exemplary embodiment, the second wiring electrode may be a common electrode commonly connected to the plurality of first pixel regions.

In an exemplary embodiment, the first arrangement and the second arrangement may be configured to offset an electric field generated from a difference in electrical polarity between the first light emitting diode and the second light emitting diode.

According to one embodiment of the present disclosure, the following effects are obtained.

The display device using light emitting diodes (LEDs) according to the embodiments of the present disclosure can offset biased light distribution of each light emitting diode (LED) affected by crystallinity of such LEDs. In other words, asymmetric light distribution of the LEDs can be offset.

The display device using LEDs according to the embodiments of the present disclosure can solve the problem of colors appearing differently depending on a viewing direction when the display device is viewed from the outside.

The display device using LEDs according to the embodiments of the present disclosure can reduce parasitic capacitance arising from a difference in electrical polarity between the LEDs.

The display device using LEDs according to the embodiments of the present disclosure can solve a ghosting phenomenon that may occur due to such parasitic capacitance.

The display device using LEDs according to the embodiments of the present disclosure can offset an electric field arising from a difference in electrical polarity between the LEDs.

The display device using LEDs according to the embodiments of the present disclosure can correct a difference in color between the left and right sides of the display by visually reinforcing some areas with weak colors when viewing the display from one direction. Accordingly, the color viewing angle can be improved in the final product stage of the display device.

Meanwhile, a one-side wiring electrode is disposed on the same layer (i.e., the outermost layer) as the LED, thereby reducing the number of via holes.

Accordingly, the degree of freedom in pixel arrangement may be increased, and when high-density pixel arrangement is implemented in response to the increasing resolution, such pixels may not be affected by via holes.

Furthermore, according to another embodiment of the present disclosure, there are additional technical effects not mentioned here. A person skilled in the art may understand this via the entire meaning of the present document and drawings.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure.

DETAILED DESCRIPTION OF THE DISCLOSURE

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting diode mentioned in this specification is a concept including an LED, a micro-LED, and the like, and may be used interchangeably therewith.

Figure 1:
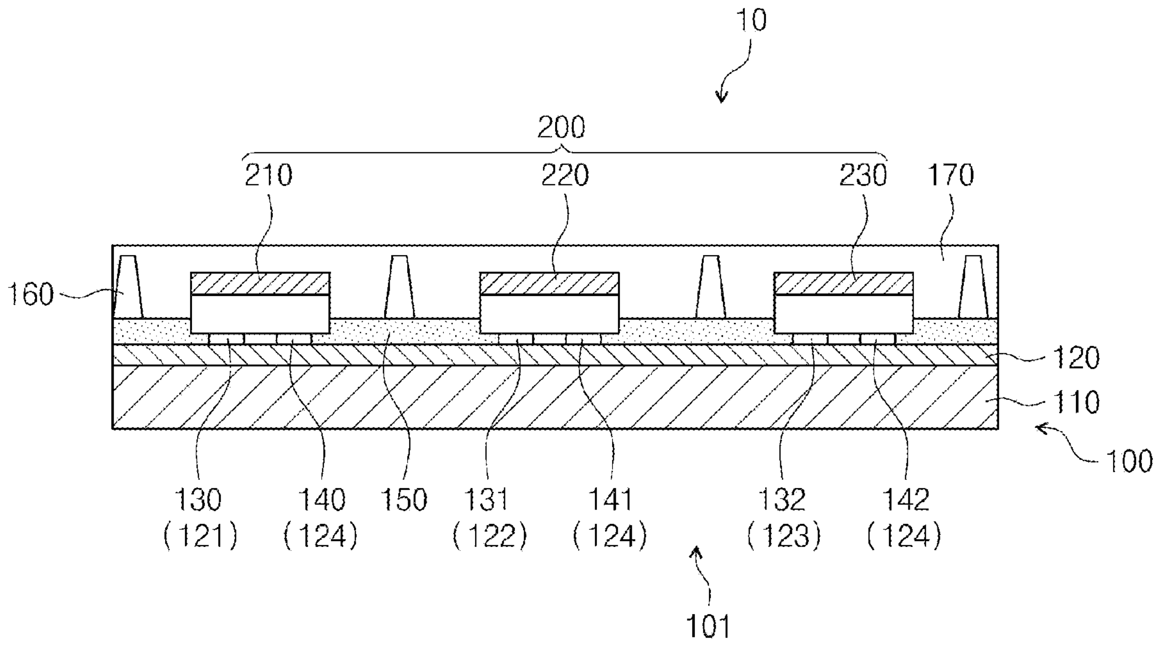
FIG. 1 is a schematic diagram illustrating a display device using light emitting diodes (LEDs) according to an embodiment of the present disclosure.

FIG. 1 is a schematic diagram of a display device using light emitting diodes (LEDs) according to an embodiment of the present disclosure.

Referring to FIG. 1, in a display device 10, an individual unit pixel region 101 may be partitioned on a wiring substrate 100, and multiple light emitting diodes 200:210, 220, and 230 may be installed within such unit pixel region 101.

In this regard, the individual light emitting diodes 210, 220, and 230 installed in the unit pixel region 101 may substantially correspond to sub-pixels, respectively. For example, three sub-pixels may be gathered to constitute one pixel. In FIG. 1, the three light emitting diodes 210, 220, and 230 may correspond to red, green, and blue light emitting diodes, respectively.

Each of the light emitting diodes 210, 220, and 230 may be electrically connected to a pair of electrode pads 130 and 140/131 and 141/132 and 142. In this case, as an example, the electrode pads 130, 131, and 132 (hereinafter, referred to as first electrode pads) arranged on one side in FIG. 1 may be connected to first wiring electrodes (signal electrodes or data electrodes) 121, 122, and 123, respectively.

In addition, the electrode pads 140, 141, and 142 arranged on the other side (referred to hereinafter as second electrode pads) may be connected to a second wiring electrode (a common electrode or a scan electrode) 124. However, an opposite case thereof is also possible. In FIG. 1, the signal electrodes 121, 122, and 123 and the common electrode 124 are omitted due to an arrangement of electrodes and pads.

In one example, in some cases, the first electrode pads 130, 131, and 132 may respectively correspond to the signal electrodes 121, 122, and 123, and the second electrode pads 140, 141, and 142 may correspond to the common electrode 124.

Hereinafter, reference numerals of the electrode pads and the wiring electrodes are used interchangeably for description. That is, the electrode pads and the wiring electrodes may be described using the same reference numerals.

As such, unit sub-pixels may be defined at points where the first wiring electrodes 121, 122, and 123 and the second wiring electrode 124 intersect each other.

In one example, when the first wiring electrodes 121, 122, and 123 are the signal electrodes (or the data electrodes), such first wiring electrodes 121, 122, and 123 or the first electrode pads 130, 131, and 132 may be connected to a TFT layer 120 on which a thin film transistor (TFT) is disposed. Accordingly, each of the light emitting diodes 210, 220, and 230 may be driven by switching driving resulted from such TFT layer 120.

In FIG. 1, the TFT layer 120 is briefly shown as a single layer, but the TFT layer 120 may include multiple TFT areas capable of performing the switching operation. For example, each TFT area may include a gate electrode, a source electrode, a drain electrode, an insulating layer disposed therebetween, a via electrode that may be connected to the first wiring electrodes 121, 122, and 123 or the first electrode pads 130, 131, and 132, and the like. A detailed description of this is omitted. Each of such TFT areas may be connected to each of the light emitting diodes 210, 220, and 230.

The multiple light emitting diodes 200; 210, 220, and 230 may be installed to be electrically connected onto the wiring electrodes 121, 122, 123, and 124 to form individual sub-pixels.

As mentioned above, such light emitting diodes 200 may include the red light emitting diode 210, the green light emitting diode 220, and the blue light emitting diode 230, and such three light emitting diodes 210, 220, and 230 may form the individual sub-pixels and be repeatedly positioned on the wiring substrate 100. Such light emitting diodes 210, 220, and 230 may include at least one of an organic light emitting diode and an inorganic light emitting diode. For example, the light emitting diodes 210, 220, and 230 may be the inorganic semiconductor light emitting diodes (light emitting diodes; LEDs).

Such semiconductor light emitting diode (LED) 200 may have a size of a micrometer (μm) unit. The micrometer (μm) size may mean that a width of at least one surface of the light emitting diode 200 has a size of several to hundreds of micrometers (μm).

The TFT layer 120 may be positioned on a substrate 110, and an insulating layer 150 may be coated on the TFT layer 120. Such insulating layer 150 may be coated on a connection portion between the wiring electrodes 121, 122, 123, and 124, the electrode pads 130, 131, 132/140, 141, and 142, and the light emitting diodes 210, 220, and 230.

For example, the individual light emitting diodes 210, 220, and 230 may be separated from each other by a partition wall 160. In addition, a cover layer 170 may be positioned on the light emitting diodes 210, 220, and 230 and the partition wall 160.

As described above, the light emitting diodes 210, 220, and 230 may form the individual sub-pixels and be repeatedly positioned on the wiring substrate 100. For example, each pixel region 101 may be repeatedly disposed on the wiring substrate 100.

In this regard, the pixel regions 101 may be repeatedly positioned along one line of the data electrodes (the first wiring electrodes) 121, 122, and 123 or line of the scan electrode (the second wiring electrode) 124 in a longitudinal direction. For example, in FIG. 1, the red light emitting diode 210, the green light emitting diode 220, and the blue light emitting diode 230 may be repeatedly positioned along a left and right direction. For example, a red light emitting diode of an adjacent pixel region may be positioned on a right side of the blue light emitting diode 230.

Figure 8:
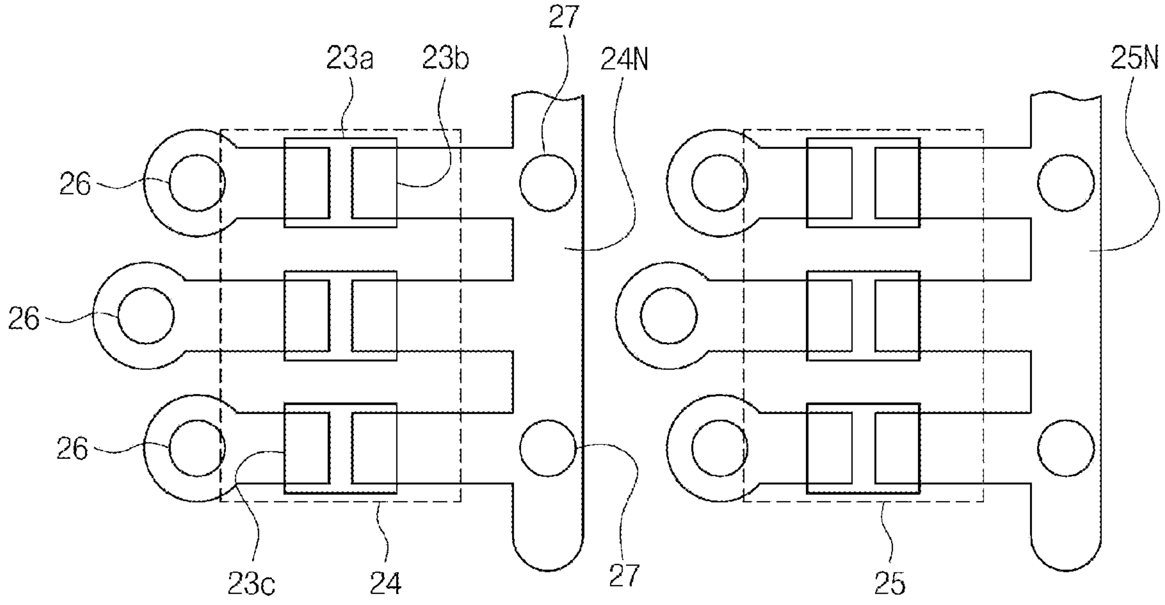
FIG. 8 is a plan view illustrating an example arrangement of wiring electrodes of a display device using LEDs according to a comparative example.

In one example, another data electrode (first wiring electrode) line or scan electrode (second wiring electrode) line adjacent to one data electrode (first wiring electrode) line or scan electrode (second wiring electrode) line in a parallel manner may be located (see FIG. 8). In this regard, a pixel region 102 (see FIG. 8) having the same arrangement of the light emitting diodes 210, 220, and 230 as the pixel region 101 may be located on the adjacent data electrode (first wiring electrode) line or scan electrode (second wiring electrode) line.

In this case, light emitting diodes having the same color may be located adjacent to each other in adjacent pixel regions. For example, the red light emitting diode 210, the green light emitting diode 220, and the blue light emitting diode 230 may be repeatedly positioned along the data electrode (first wiring electrode) line or the scan electrode (second wiring electrode) line, but light emitting diodes having the same color may be repeatedly positioned in a direction perpendicular to such data electrode (first wiring electrode) line or the scan electrode (second wiring electrode) line.

In this regard, according to one embodiment of the present disclosure, two adjacent light emitting diodes may have different arrangements. For example, referring to FIG. 1, the red light emitting diode 210 and the green light emitting diode 220 adjacent to the red light emitting diode 210 may have different arrangements.

For example, in the red light emitting diode 210, a first-type electrode, for example, an N-type electrode, may be positioned on the first wiring electrode 130, and in the green light emitting diode 220, a second-type electrode, for example, a P-type electrode, may be positioned on the first wiring electrode 131. Such different arrangements may also be made on the green light emitting diode 220 and the blue light emitting diode 230.

That is, the red light emitting diode 210 and the green light emitting diode 220 adjacent to such red light emitting diode 210 may have symmetrical arrangements with respect to electrode positions of the respective light emitting diodes 210 and 220.

In one example, a light emitting diode (e.g., the red light emitting diode 210) located in one pixel region 101 and a light emitting diode (e.g., the red light emitting diode 210) located in the adjacent pixel region 102 may have symmetrical arrangements with respect to the electrode positions as described above.

In other words, on the wiring substrate 100, a first light emitting diode 210 located in the first pixel region 101 and installed in a first arrangement, and a second light emitting diode 210 located in the second pixel region 102 adjacent to such first pixel region 101 and installed in a second arrangement symmetric with respect to the first arrangement may be positioned.

With the first and second arrangements of the light emitting diodes 210 as described above, a parasitic capacitance generated from a difference in electrical polarity between the first light emitting diode and the second light emitting diode may be reduced.

In addition, with the first arrangement and the second arrangement of the light emitting diodes 210 as described above, an electric field generated from the difference in the electric polarity between the first light emitting diode and the second light emitting diode may be canceled.

The light emitting diodes (LEDs) 210 having these different arrangements and the effects thereof will be described in detail later.

Figure 2:
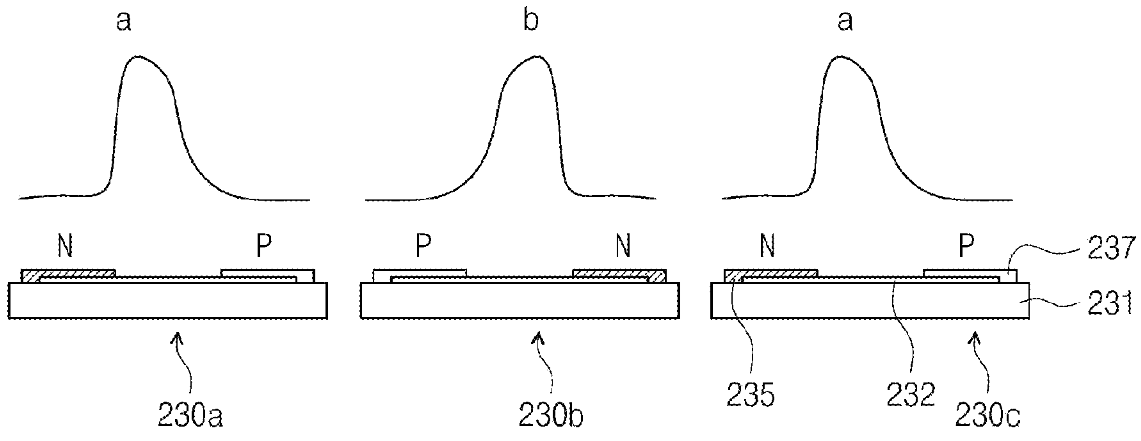
FIG. 2 is a schematic diagram illustrating an example of subpixel arrangement of a display device using light emitting diodes (LEDs) according to an embodiment of the present disclosure.
Figure 3:
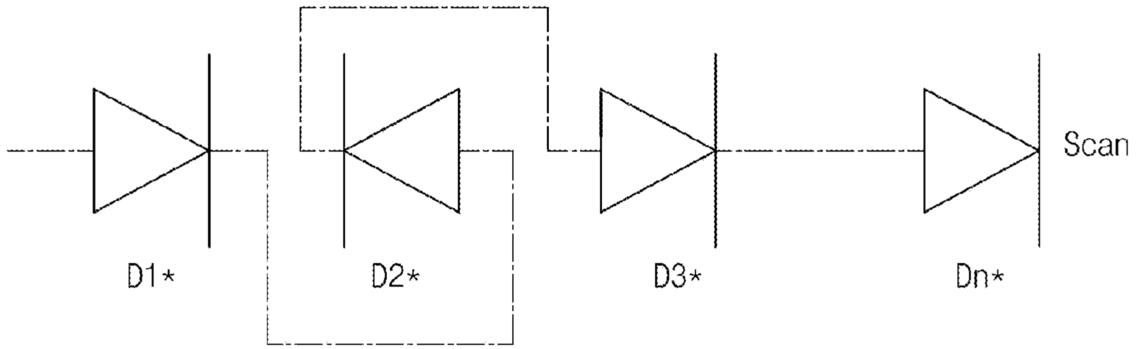
FIG. 3 is a circuit diagram illustrating an example of subpixel arrangement of a display device using LEDs according to an embodiment of the present disclosure.

FIG. 2 is a schematic diagram illustrating an example of subpixel arrangement of a display device using light emitting diodes (LEDs) according to an embodiment of the present disclosure. FIG. 3 is a circuit diagram illustrating an example of subpixel arrangement of a display device using LEDs according to an embodiment of the present disclosure.

Figure 4:
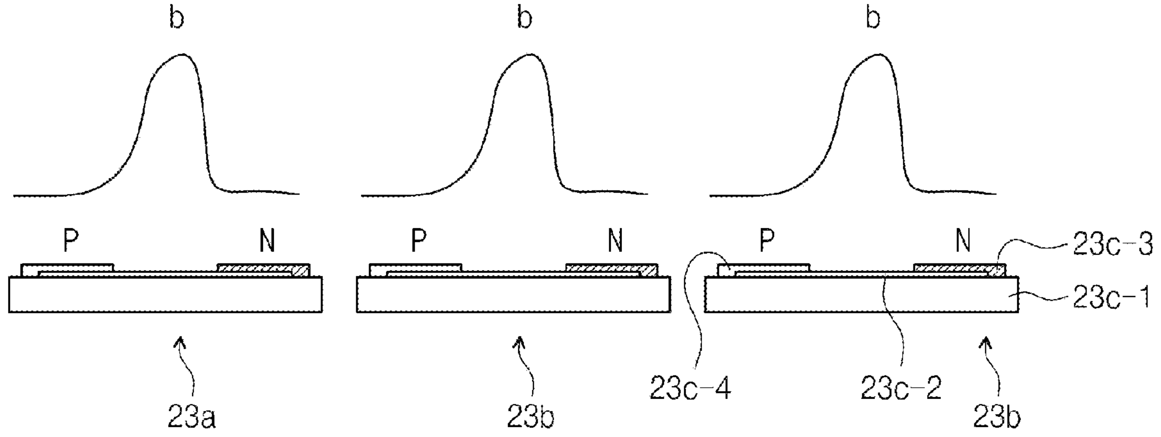
FIG. 4 is a schematic diagram illustrating an example of subpixel arrangement of a display device using LEDs according to a comparative example.
Figure 5:
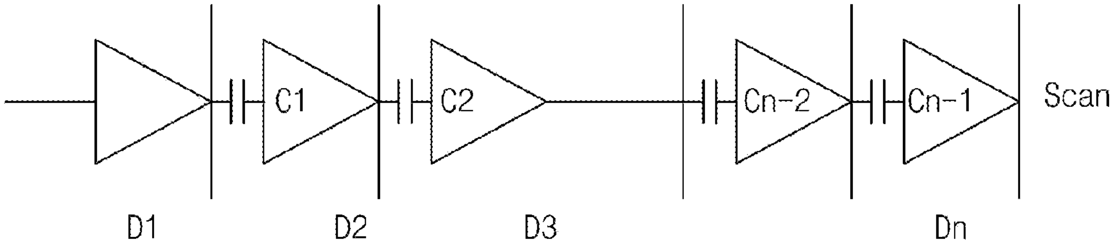
FIG. 5 is a circuit diagram illustrating an example of subpixel arrangement of a display device using LEDs according to a comparative example.

FIG. 4 is a schematic diagram illustrating an example of subpixel arrangement of a display device using LEDs according to a comparative example. FIG. 5 is a circuit diagram illustrating an example of subpixel arrangement of a display device using LEDs according to a comparative example.

FIG. 2 shows a state in which the first LED **230*a* and the second LED 230*b* adjacent to each other are located to respectively have a first arrangement and a second arrangement different from each other. Additionally, the second LED 230*b* and the third LED 230*c* may also be located to have different arrangements from each other. Referring to FIG. 3**, it can be seen that the light emitting diodes (D1*, D2*, D3*, . . . , Dn*) are alternately connected in opposite arrangements.

For example, the first LED **230*a* and the third LED 230*c* may be located in a first arrangement, and the second LED 230*b* disposed between the first LED 230*a* and the third LED 230*c*** may be located in a second arrangement.

At this time, the first LED **230*a*, the second LED 230*b*, and the third LED 230*c* may all be light emitting diodes (LEDs) that emit light of the same color. For example, the first LED 230*a*, the second LED 230*b*, and the third LED 230*c*** may all be blue LEDs.

Here, the first arrangement may be an arrangement in which the N electrode 235 is located on the left in FIG. 5, and the P electrode 237 is located on the right in FIG. 5. In each LED (**230*a*, 230*b*, 230*c*), a semiconductor layer 232 may be located on the substrate 231, and a first-type electrode (e.g., N-type electrode 235) and a second-type electrode (e.g., P-type electrode 237) may be arranged to contact the semiconductor layer 232**.

That is, each LED (**230*a*, 230*b*, 230*c*) may include a substrate 231, a semiconductor layer 232, a first-type electrode 235, and a second-type electrode 237. At this time, the respective LEDs (230*a*, 230*b*, 230*c*) may have different arrangements with respect to the direction in which the first-type electrode 235 and the second-type electrode 237** are connected to each other.

Referring to FIG. 2, each LED (**230*a*, 230*b*, 230*c*) may have asymmetric light distribution ("a" or "b") with respect to the direction along which the first-type electrode 235 and the second-type electrode 237 are connected to each other. For example, the first LED 230*a* and the third LED 230*c* may have light distribution (a) that is biased to the left. This may correspond to the first arrangement. Additionally, the second LED 230*b* located between the first LED 230*a* and the third LED 230*c*** may have the light distribution (b) that is biased to the right. This structure may correspond to the second arrangement.

This structure may be a result of material characteristics of at least one of the substrate 231 and the semiconductor layer 232. For example, the above-described phenomenon may occur because the crystal structure of at least one of the substrate 231 and the semiconductor layer 232 has an inclined shape. This will be described in detail later.

As a comparative example, FIG. 4 shows an example case in which each light emitting diode (**23*a*, 23*b*, 23*c*) forms the same arrangement (b) and also shows the resulting light distribution (b). For example, the LED 23*c* may include a semiconductor layer 23*c*-2 disposed over a substrate 23*c*-1, and a first-type electrode 23*c*-3 and a second-type electrode 23*c*-4 connected to the semiconductor layer 23*c*-2. Referring to FIG. 5**, it can be seen that the LEDs (D1, D2, D3, . . . , Dn) are all connected in the same arrangement.

As shown in FIG. 4, when constituting the display device, each of the LEDs (**23*a*, 23*b*, 23*c*) may form each subpixel while having an asymmetric light distribution (b) with respect to the direction in which the first-type electrode 23*c*-3 and the second-type electrode 23*c*-4** are connected to each other. As a result, the problem of colors appearing differently depending on the viewing direction when the display device is viewed from the outside may occur.

The polarity arrangement of the LEDs (**23*a*, 23*b*, 23*c*) is configured such that the first-type electrode 23*c*-3 and the second-type electrode 23*c*-4 are sequentially repeated, so that unintended parasitic capacitance may occur due to an electrical field formed by a polarity difference between the first-type electrode 23*c*-3 and the second-type electrode 23*c*-4 (or between the signal- and common-electrodes connected to the first-type and second-type electrodes 23*c*-3 and 23*c*-4**).

As a result, even when the electric field is dissipated, discharge of parasitic capacitance may not be normally performed, and thus a situation in which adjacent LEDs are unintentionally turned on may occur. For example, when the diode D3 is turned on, other diodes D1 and D2, which should be turned off, may unintentionally remain turned on. The corresponding effect may be accumulated by the total number of LEDs (**23*a*, 23*b*, 23*c***) used in the display device, such that ghosting may occur in display products.

However, as in one embodiment of the present disclosure, when adjacent LEDs (**230*a*, 230*b*, 230*c*) have different arrangements with respect to the direction in which the first-type electrode 235 and the second-type electrode 237** are connected to each other, the above-described problem can be solved.

As an exemplary embodiment, FIG. 2 shows a state in which light distribution (a, b) of each light emitting diode (**230*a*, 230*b*, 230*c*) is biased toward the N-type electrode 235. However, as an example, light distribution of all LEDs (230*a*, 230*b*, 230*c*) is not biased toward the N-type electrode 235. That is, conversely, the light distribution of each LED (230*a*, 230*b*, 230*c*) may also be biased toward the P-type electrode 237**.

Therefore, if the adjacent LEDs (**230*a*, 230*b*, 230*c*) have different arrangements in the direction in which the first-type electrode 235 and the second-type electrode 237** are connected to each other, the biased light distributions (a, b) can be offset from each other to achieve uniform light distribution. In other words, the problem of colors appearing differently depending on the viewing direction when looking at the display device from the outside can also be solved.

By using the first and second arrangements of the LEDs (230*a*, 230*b*, 230*c*), parasitic capacitance arising from a difference in electrical polarity between the LEDs (230*a*, 230*b*, 230*c*) can be reduced.

In addition, by using the first and second arrangements of the LEDs (230*a*, 230*b*, 230*c*), the electric field arising from the difference in electrical polarity between the LEDs (230*a*, 230*b*, 230*c*) can be offset.

Figure 6:
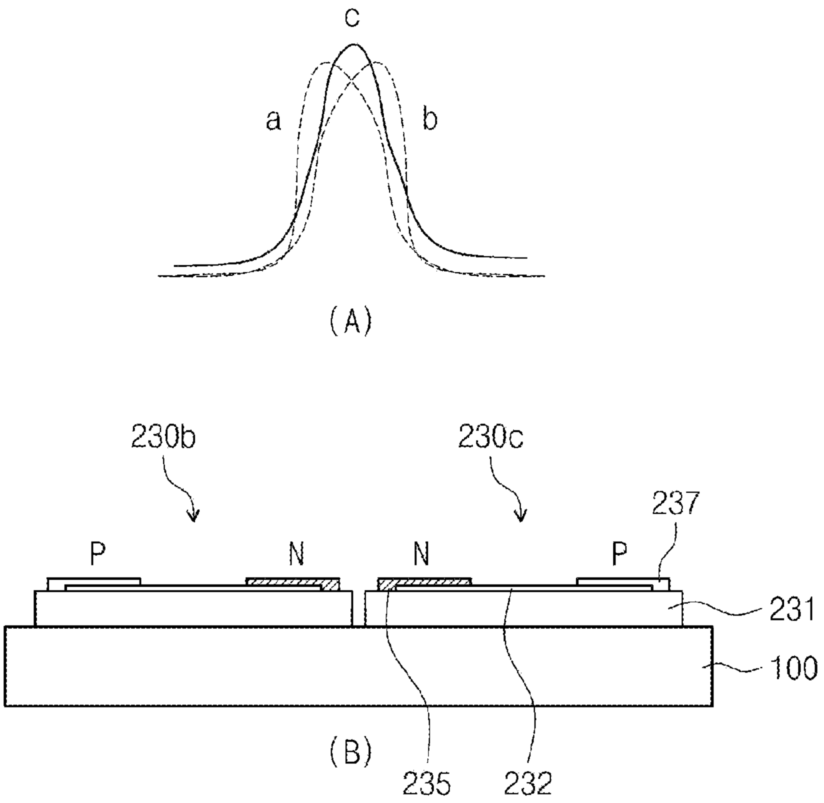
FIG. 6 is a schematic diagram illustrating the effect of subpixel arrangement of a display device using LEDs according to an embodiment of the present disclosure.

FIG. 6 is a schematic diagram illustrating the effect of subpixel arrangement of the display device using LEDs according to an embodiment of the present disclosure.

Referring to FIG. 6, LEDs (230*b*, 230*c*) may be installed on the wiring substrate 100 to form subpixels.

At this time, referring to FIG. 6(B), the wiring substrate 100 may include wiring electrodes (123, 124) including the first wiring electrode 123 and the second wiring electrode 124 arranged on the wiring substrate 100, as described above with reference to FIG. 1. The LEDs (230*b*, 230*c*) in each unit pixel region are electrically connected to the first wiring electrode 123 and the second wiring electrode 124. That is, the subpixel arrangement of FIG. 6 may correspond to the case of the blue LED 230 of FIG. 1.

Here, referring to FIGS. 6(A) and 6(B) together, the LEDs (230*b*, 230*c*) may include the first LED 230*b* and the second LED 230*c*. The first LED 230*b* may be disposed in the first pixel region and may be installed to have the first arrangement. The second LED 230*c* may be disposed in the second pixel region adjacent to the first pixel region and may be installed to have the second arrangement symmetrical to the first arrangement.

Each of the first light emitting diode 230*b* and the second light emitting diode 230*c* may include the substrate 231, the semiconductor layer 232, the first-type electrode 235, and the second-type electrode 237. In this regard, the first light emitting diode 230*b* and the second light emitting diode 230*c* may have different arrangements with respect to the direction for connecting the first-type electrode 235 and the second-type electrode 237 to each other.

Accordingly, the light distribution a biased to one side by the first arrangement and the light distribution b biased to the other side by the second arrangement may be merged together to form a light distribution ‘c’ that is not biased and faces the center. That is, the asymmetrical light distributions may be canceled by the first arrangement of the first light emitting diode 230*b* and the second arrangement of the second light emitting diode 230*c* as described above.

In this regard, as described above, the first light emitting diode 230*b* and the second light emitting diode 230*c* may be light emitting diodes that emit light of the same color located in the adjacent pixel regions, for example, the blue light emitting diodes.

When a positive voltage is applied to a light emitting diode (LED) with a PN junction structure, charges and holes recombine with each other in an area where a P-area and an N-area meet each other to emit light. In this regard, a portion where the greatest amount of light is emitted is not a center of the area where the P-area and the N-area meet each other, but is biased. Therefore, when a display is manufactured with such an LED, a color of the display may appear differently depending on a direction for viewing the display.

However, as described above, when the first arrangement of the first light emitting diode 230*b* and the second arrangement of the second light emitting diode 230*c* are symmetrical with each other, a color difference of the display perceived on left and right sides when viewing the display from one side may be compensated for by visually reinforcing an area with weak color. Therefore, an effect of enhancing a color viewing angle in a final product stage of the display device may be obtained.

In addition, an electric field formed by a difference in polarity between the light emitting diodes 230*b* and 230*c* may be removed by the symmetrical arrangements of the first light emitting diode 230*b* and the second light emitting diode 230*c*, so that a parasitic capacitance may be prevented from being generated. In addition, the ghost phenomenon that may occur due to such parasitic capacitance may be improved.

Figure 7:
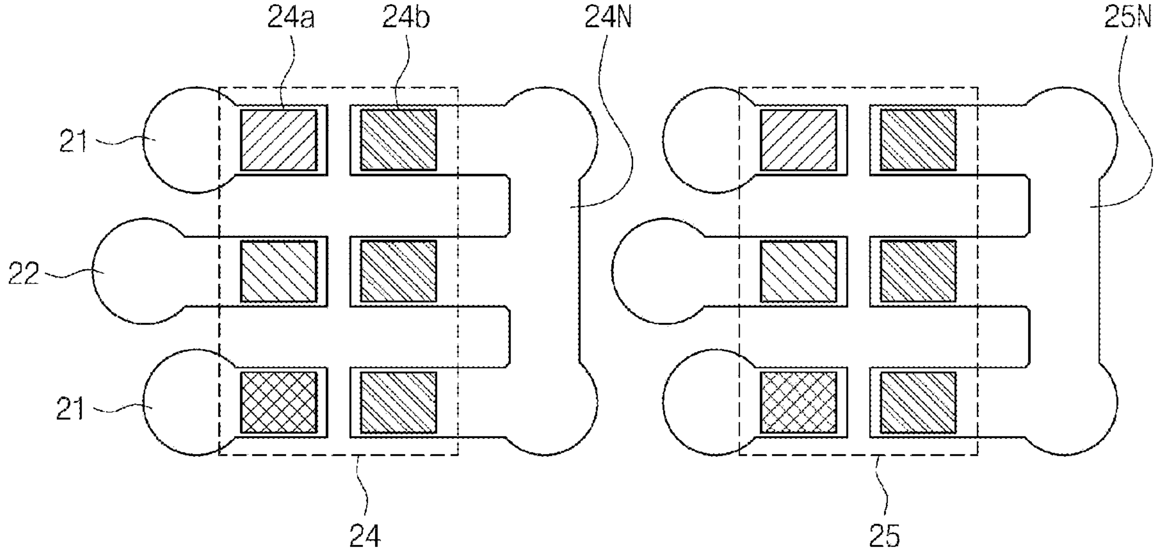
FIG. 7 is a plan view illustrating an example arrangement of wiring electrodes of a display device using LEDs according to a comparative example.

FIG. 7 is a plan view illustrating an example arrangement of wiring electrodes of the display device using LEDs according to a comparative example. FIG. 8 is a plan view illustrating an example arrangement of wiring electrodes of a display device using LEDs according to a comparative example.

Referring to FIG. 7, the structure of electrodes and electrode pads of a display device according to a comparative example for comparison with the present disclosure is partially shown.

Referring to FIGS. 7 and 8, two pixel regions (24, 25) are shown, and each pixel region may include three light sources (23*a*, 23*b*, 23*c*).

The light source may include a red LED 23*a*, a green LED 23*b*, and a blue LED 23*c*. Each LED (23*a*, 23*b*, 23*c*) may be electrically connected to a pair of electrode pads (24*a*, 24*b*). For example, the first electrode pad 24*a* of each LED (23*a*, 23*b*, 23*c*) may be connected to a pixel electrode (not shown) through a via hole 26, and the second electrode 24*b* of each LED (23*a*, 23*b*, 23*c*) may be connected to a common electrode (not shown) through a via hole 27.

Here, the second electrode pad 24*b* connected to the three LEDs (23*a*, 23*b*, 23*c*) may be connected to a common electrode and can be connected to each other by the connection electrodes (24N, 25N).

At this time, extension portions (21, 22) are formed on the first electrode pad 24*a*, and via holes 26 may be located in the extension portions (21, 22).

As displays using light emitting diodes such as LEDs develop, demand for displays with a narrow pitch (i.e., a distance between LED light sources) is increasing. In order to implement narrow-pitch displays, high-density design technology for LED light sources is required, and accordingly, a printed circuit board (PCB) constituting the wiring substrate tends to be designed and implemented in multiple layers.

In such a multilayer wiring substrate, electrical connection between multiple layers can be achieved through via holes. At this time, the via holes may be located to overlap an electrode pad region in which LED light sources are located (transferred). Referring to FIG. 8, via holes 26 are located in the extension portions (21, 22) formed on the first electrode pad 24*a*.

If the via holes are spaced apart from each other by a certain distance on the electrode pad, the shape and width of the electrode pad may not be affected by the via holes. However, due to a high level of image quality expected as described above, as the pitch becomes narrower, a spatial margin for positioning the via hole farther away from the electrode pad becomes reduced in size. Accordingly, via holes may eventually overlap the electrode pad.

For example, the electrode pad connected to the common electrode can be connected using a single via hole, but the electrode pad connected to the pixel electrode must be connected to RGB LEDs that makes up each subpixel, so that the density of via holes for the common electrode and the density of via holes for the pixel electrode may be different from each other. For example, the density of via holes connected to the pixel electrode increases by approximately three times or more. Accordingly, the probability that one or more via holes will overlap the electrode pad may increase.

When the via hole overlaps the pad, the shape and area of the electrode pad 24*a* connected to the negative (−) electrode (i.e., scan electrodes 24N and 25N) and the other pad 24*b* connected to the positive (+) electrode may be formed differently depending on the density of via holes (26, 27) shown in FIG. 8.

Accordingly, when applying solder for transferring (bonding) the LEDs on the electrode pads (24*a*, 24*b*), the amount of solder may vary. Therefore, the amount of solder on both electrode pads may vary. This may result in a difference in solder height. Accordingly, the left and right heights of the LEDs (23*a*, 23*b*, 23*c*) may vary, and the LEDs (23*a*, 23*b*, 23*c*) may be inclined to one side without being flat and then transferred to the pad. In this way, when the LEDs (23*a*, 23*b*, 23*c*) are tilted and transferred, the direction of light emission from the LEDs (23*a*, 23*b*, 23*c*) is changed and the intensity of light changes depending on the viewing angle, which may cause abnormal points in image quality.

Figure 9:
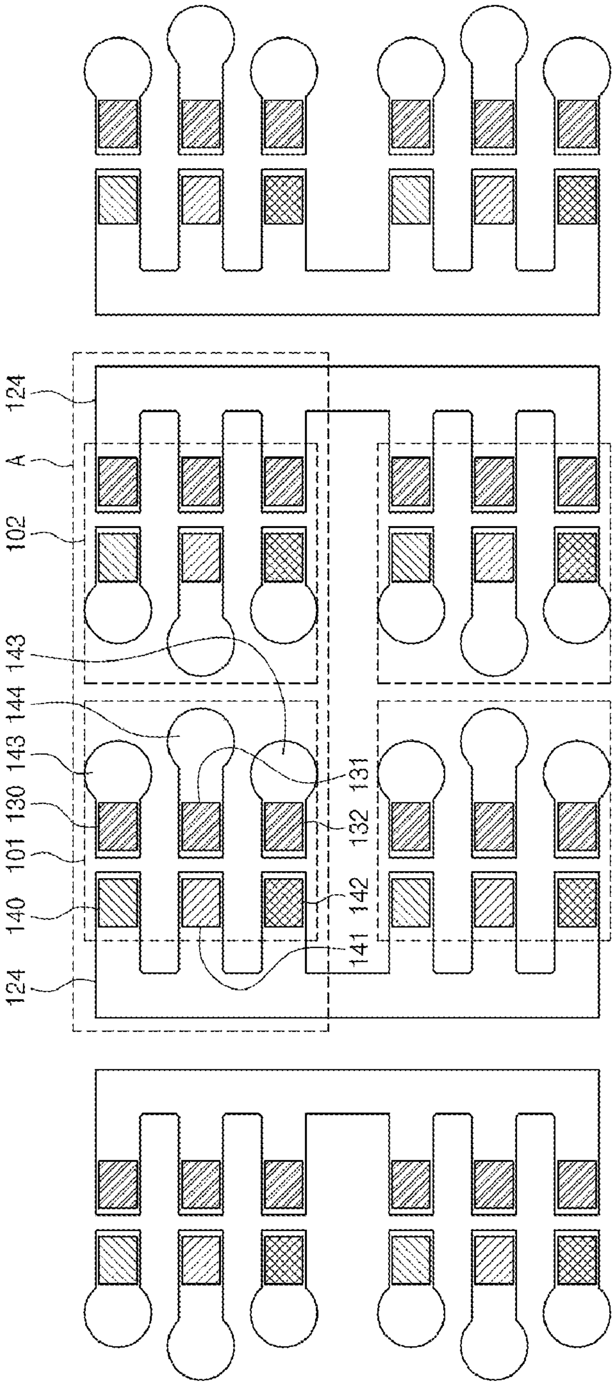
FIG. 9 is a plan view illustrating an example arrangement of wiring electrodes of a display device using LEDs according to a first embodiment of the present disclosure.
Figure 10:
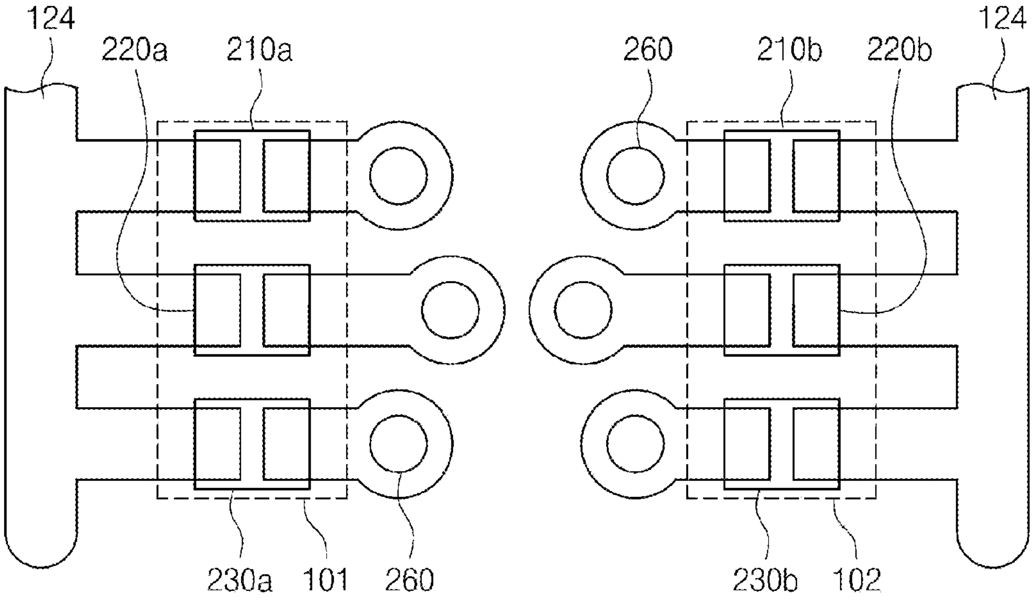
FIG. 10 is a detailed view illustrating the portion 'A' of FIG. 9.

FIG. 9 is a plan view illustrating an example arrangement of wiring electrodes of a display device using LEDs according to a first embodiment of the present disclosure. FIG. 10 is a detailed view illustrating the portion 'A' of FIG. 9.

A plurality of unit pixel regions may be defined on the wiring substrate 100 (see FIG. 1). First wiring electrodes (121, 122, 123) and second wiring electrodes 124 may be provided on the wiring substrate 100. As described above, for example, the first wiring electrodes (121, 122, 123) may refer to signal electrodes or data electrodes. Additionally, the second wiring electrode 124 may refer to a common electrode or a scan electrode.

In an exemplary embodiment, electrode pads 130, 131, and 132 (hereinafter referred to as first electrode pads) arranged in one direction may be connected to the first wiring electrodes 121, 122, and 123 (i.e., signal electrodes or data electrodes). Additionally, the electrode pads 140, 141, and 142 (hereinafter referred to as second electrode pads) arranged in the other direction may be connected to the second wiring electrode 124 (i.e., the common electrode or the scan electrode).

For example, the first wiring electrodes (121, 122, 123) forming the signal electrode or the data electrode may refer to the positive (+) electrodes, and the second wiring electrode 124 forming the common electrode or the scan electrode may refer to the negative (−) electrode. Accordingly, the P electrode of the LED may be connected to the first electrode pads (130, 131, 132), and the N electrode of the LED may be connected to the second electrode pads (140, 141, 142). However, the scope of the present disclosure is not limited thereto. That is, as another example, the first wiring electrodes (121, 122, 123) forming the signal electrode or the data electrode may refer to the negative (−) electrodes, and the second wiring electrode 124 forming the common electrode or the scan electrode may refer to the positive (+) electrodes.

Referring to FIGS. 9 and 10, for example, the first electrode pads (130, 131, 132) connected to the first wiring electrodes (121, 122, 123) and the second electrode pads (140, 141, 142) connected to the second wiring electrode 124 are shown.

The unit pixel region 101 may include the LEDs (210*a*, 220*a*, 230*a*) that are electrically connected to and installed in the first electrode pads (130, 131, 132) to form a subpixel, and the unit pixel region 102 may include the LEDs (210*b*, 220*b*, 230*b*) that are electrically connected to and installed in the second electrode pads (140, 141, 142) to form a subpixel.

These light emitting diodes (LEDs) may include first LEDs (210*a*, 220*a*, 230*a*) disposed in the first pixel region 101 and installed with the first arrangement; and second LEDs (210*b*, 220*b*, 230*b*) disposed in the second pixel region 102 adjacent to the first pixel region 101 and installed with the second arrangement symmetrical to the first arrangement.

At this time, the second wiring electrode 124 may be disposed on the same layer as the LEDs (210*a*, 220*a*, 230*a*/210*b*, 220*b*, 230*b*). Accordingly, via holes may not be required in the second electrode pads (140, 141, 142) connected to the second wiring electrode 124.

Here, the first arrangement and the second arrangement may be arrangements in which the positions of the electrodes of the first LEDs (210*a*, 220*a*, 230*a*) and the positions of the second LEDs (210*b*, 220*b*, 230*b*) are symmetrical to each other. As described above, the first LEDs (210*a*, 220*a*, 230*a*) and the second LEDs (210*b*, 220*b*, 230*b*) may emit light of the same color.

In an exemplary embodiment, the second wiring electrode 124 corresponding to the first pixel region 101 and the adjacent second wiring electrode 124 corresponding to the second pixel region 102 may be arranged symmetrically with respect to the center portion between the first pixel region 101 and the second pixel region 102.

For example, the first pixel region 101 and the second pixel region 102 may be paired between the adjacent second wiring electrodes 124.

In an exemplary embodiment, a plurality of first pixel regions 101 or a plurality of second pixel regions 102 may be located along the second wiring electrode 124.

As mentioned above, the second wiring electrode 124 may be a common electrode commonly connected to the plurality of first pixel regions 101 or the plurality of second pixel regions 102.

In this way, by using the first arrangement and the second arrangement, the electric field generated from the difference in electrical polarity between the first LEDs (210*a*, 220*a*, 230*a*) and the second LEDs (210*b*, 220*b*, 230*b*) can be offset from each other.

In an exemplary embodiment, the first wiring electrodes (121, 122, 123) may be disposed on different layers from the LEDs (210*a*, 220*a*, 230*a*/210*b*, 220*b*, 230*b*) through via holes 260 connected to the first electrode pads (130, 131, 132). Therefore, as can be seen from FIGS. 9 and 10, the first wiring electrodes (121, 122, 123) are not shown.

For example, the second electrode pads (140, 141, 142) may include pad extensions (143, 144). These pad extension portions (143, 144) may include a first extension portion 143 and a second extension portion 144 that extends farther than the first extension portion 143.

In this case, for example, the via holes 260 may be located in the pad extensions 143 and 144 (see FIG. 10). In this way, via holes 260 may be respectively disposed in the first extension portion 143 and the second extension portion 144 that are located at different positions.

As described above, one-side wiring electrode (i.e., second wiring electrode 124) may be disposed on the same layer (i.e., the outermost layer) as the LEDs, thereby reducing the number of via holes.

Accordingly, the degree of freedom in pixel arrangement may be increased, and when high-density pixel arrangement is implemented in response to the increasing resolution, such pixels may not be affected by such via holes.

Figure 11:
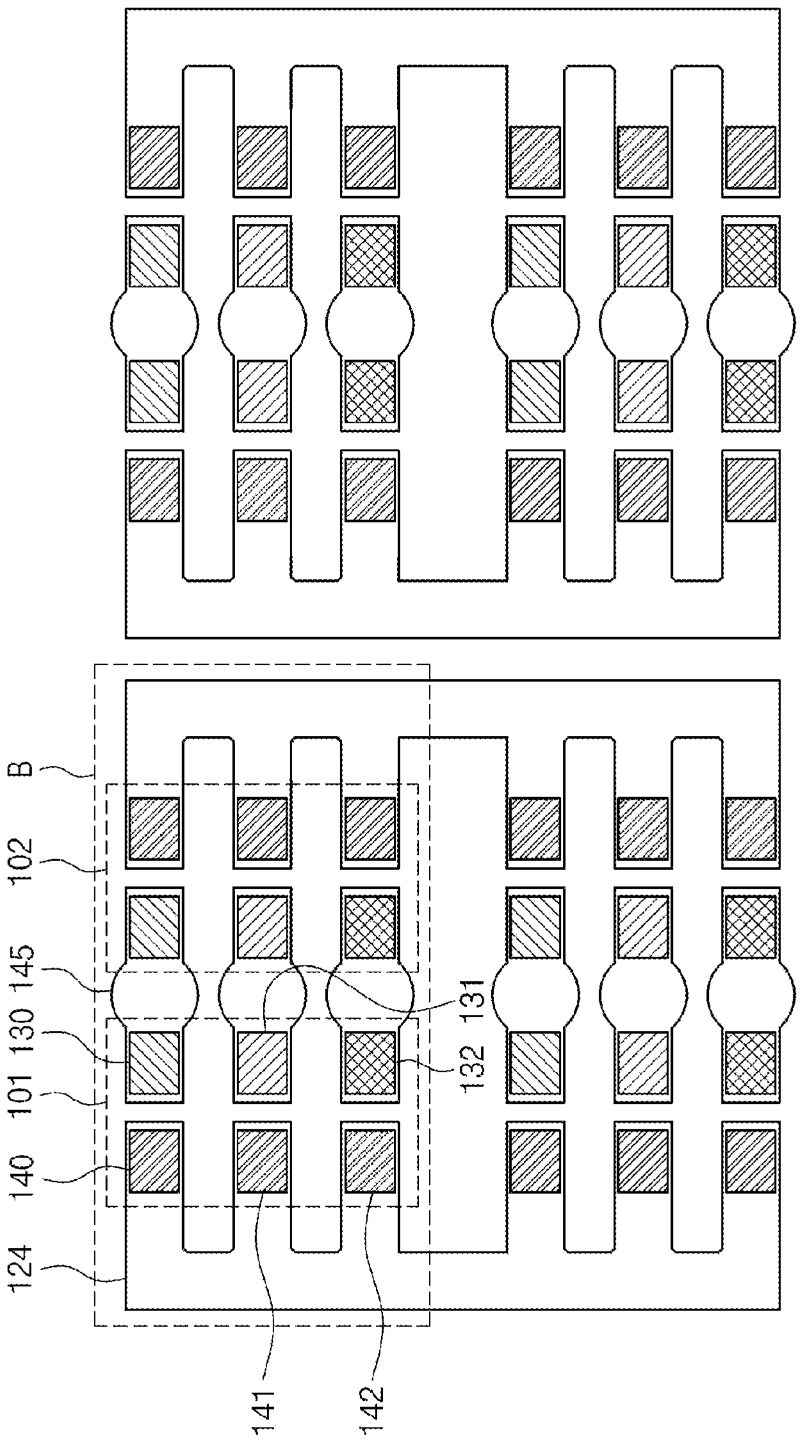
FIG. 11 is a plan view illustrating an example arrangement of wiring electrodes of a display device using LEDs according to a second embodiment of the present disclosure.
Figure 12:
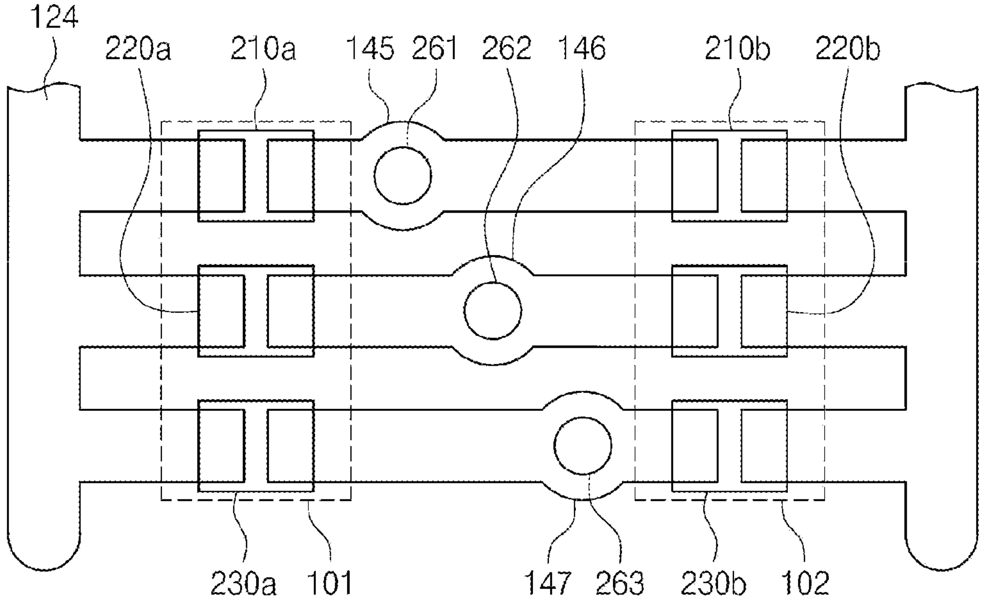
FIG. 12 is a detailed view illustrating the portion 'B' of FIG. 11.

FIG. 11 is a plan view illustrating an example arrangement of wiring electrodes of the display device using LEDs according to a second embodiment of the present disclosure. FIG. 12 is a detailed view illustrating the portion 'B' of FIG. 11.

Referring to FIGS. 11 and 12, for example, the first electrode pads (130, 131, 132) connected to the first wiring electrodes (121, 122, 123) and the second electrode pads (140, 141, 142) connected to the second wiring electrode 124 are shown.

The unit pixel region 101 may include the LEDs (210*a*, 220*a*, 230*a*) that are electrically connected to and installed in the first electrode pads (130, 131, 132) to form a subpixel, and the unit pixel region 102 may include the LEDs (210*b*, 220*b*, 230*b*) that are electrically connected to and installed in the second electrode pads (140, 141, 142) to form a subpixel.

These light emitting diodes (LEDs) may include first LEDs (210*a*, 220*a*, 230*a*) disposed in the first pixel region 101 and installed with the first arrangement; and second LEDs (210*b*, 220*b*, 230*b*) disposed in the second pixel region 102 adjacent to the first pixel region 101 and installed with the second arrangement symmetrical to the first arrangement.

At this time, the second wiring electrode 124 may be disposed on the same layer as the LEDs (210*a*, 220*a*, 230*a*/210*b*, 220*b*, 230*b*). Accordingly, via holes may not be required in the second electrode pads (140, 141, 142) connected to the second wiring electrode 124.

In an exemplary embodiment, the first wiring electrodes (121, 122, 123) may be disposed on different layers from the LEDs (210*a*, 220*a*, 230*a*/210*b*, 220*b*, 230*b*) through via holes 260 connected to the first electrode pads (130, 131, 132). Therefore, as can be seen from FIGS. 11 and 12, the first wiring electrodes (121, 122, 123) are not shown.

Referring to FIG. 11, as an example, each of the first electrode pads (130, 131, 132) may include a pad extension portion 145. A via hole 261 may be located in the pad extension portion 145.

The pad extension portions 145 may be connected to the adjacent pixel regions 101 and 102. In an exemplary embodiment, the pad extension portions 145 may be connected to each other with respect to the pixel regions 101 and 102 facing each other.

In an exemplary embodiment, for the pad extension portions 145 connected to each other, the via holes 261 may be shared by the first pixel region 101 and the second pixel region 102.

As described above, the first electrode pads (130, 131, 132) located in the first pixel region 101 and the first electrode pads (130, 131, 132) located in the second pixel region 102 may be connected to each other through the pad extension portion 145. The pad extension portions 145 may be located at the same position with respect to the vertical direction of the pixel regions 101 and 102. In this case, the distance between the adjacent pixel regions 101 and 102 may be limited so that the position of via holes 261 may also be limited.

Meanwhile, referring to FIG. 12, pad extension portions (145, 146, 147) for connecting the first electrode pads (130, 131, 132) of the LEDs (210*a*, 220*a*, 230*a*) to the adjacent pixel regions (101, 102) at different positions may be provided.

For example, the respective pad extension portions (145, 146, 147) may be located at different positions with respect to the vertical direction of the pixel regions 101 and 102. Accordingly, the via holes (261, 262, 263) may be located at different positions with respect to the vertical direction of the pixel regions 101 and 102.

Other parts not described above may be the same as the description of the first embodiment described above with reference to FIGS. 9 and 10. Therefore, redundant descriptions will herein be omitted for brevity.

Figure 13:
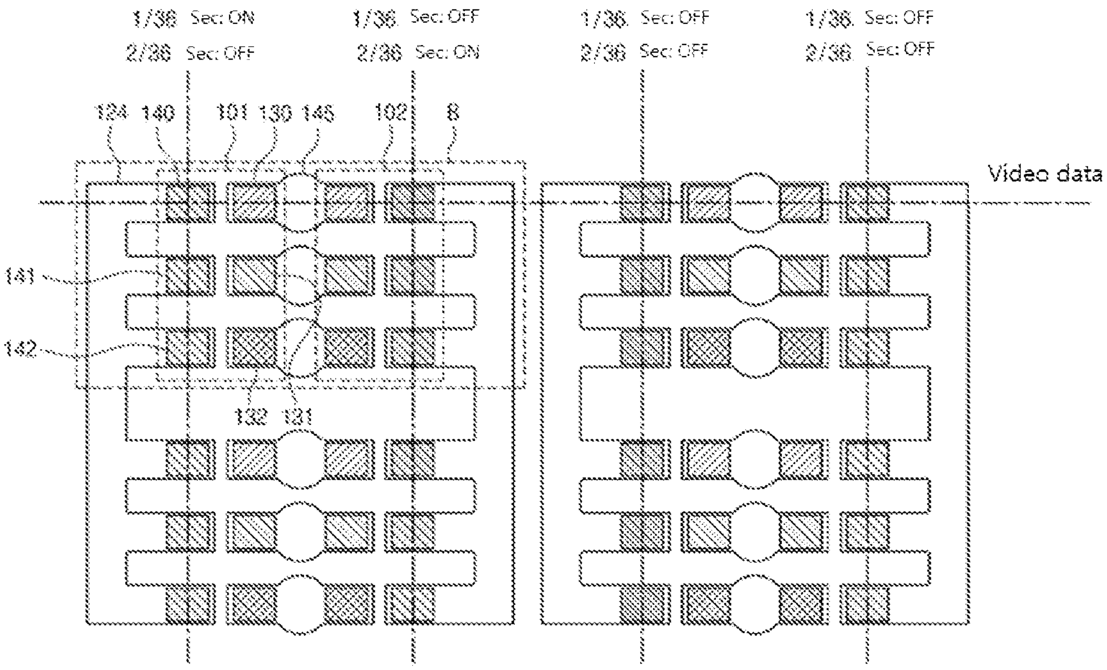
FIG. 13 is a schematic diagram illustrating an example operation of a display device using LEDs according to a second embodiment of the present disclosure.

FIG. 13 is a schematic diagram illustrating an example operation of the display device using LEDs according to a second embodiment of the present disclosure.

Referring to FIG. 13, the method for driving the display device of the second embodiment in a situation where 36 scan lines (multiplexing lines) are assigned to the display device is schematically illustrated.

The above-described display device may be driven according to a passive matrix (PM) principle.

In a display device using PM driven LEDs, a multiplexing control method in which a plurality of LED light sources (red/green/blue) are alternately turned on/off for each line of the LEDs (210*a*, 210*b*/220*a*, 220*b*/230*a*, 230*b*) arranged in horizontal lines, and another driving method in which image data can be output vertically may be used.

According to the control of the PM driving method, for example, according to the multiplexing method of 36 lines, 36 horizontal lines are sequentially and alternately turned on according to a time divisional control method. That is, only one line may be turned on at the same time section. When LEDs of one line are turned on per unit time, the remaining 35 horizontal lines may be turned off.

The number of vertically connected LEDs arranged in this horizontal line may depend on the number of pixels of RGB data controlled by the driver IC.

In the PM driving type image data output control, a plurality of LEDs arranged in the vertical line are connected, so that the same image data can be output to the plurality of LEDs. For example, in the 36-line multiplexing method, 36 LEDs can be connected together vertically in one vertical line. Therefore, the same data is output to the 36 LEDs at the same time, another image data is output at the next time according to a difference between unit times at which the horizontal lines are alternately turned on.

According to this PM driving method, horizontal lines are equally connected together as multiplexing lines, and vertical lines are equally connected together as image data lines.

The horizontal line for multiplexing and the vertical line for image data output control can be equally applied even if multiplexing is changed to vertical-line multiplexing and image data output control is changed to horizontal-line output control.

The LED is composed of sub-light sources 210, 220, and 230 of R, G, and B, and emits light by applying voltage to the positive (+) and negative (−) electrodes applied to R, G, and B sub-light sources.

Referring to FIG. 13, the positive (+) electrodes of the R, G, and B sub-light sources are configured such that individual data may be applied to to the R, G, and B sub-light sources according to the color of image data, and the negative (−) electrode of the R, G, and B sub-light sources are configured such that sub-light sources are tied together with a common electrode and connected to each other.

Figure 14:
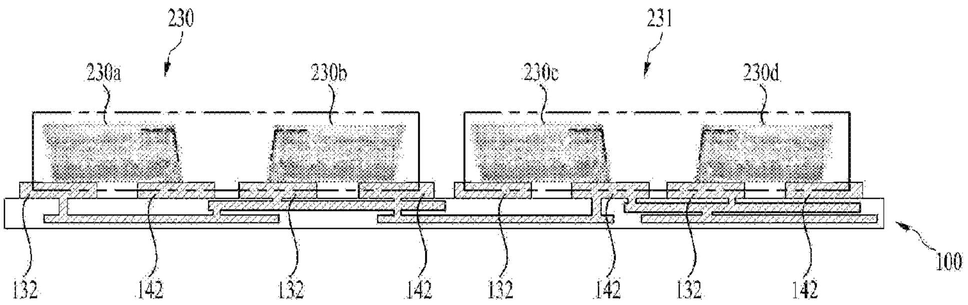
FIG. 14 is a schematic diagram illustrating a specific example of subpixel arrangement of a display device using LEDs according to an embodiment of the present disclosure.

FIG. 14 is a schematic diagram illustrating a specific example of subpixel arrangement of the display device using LEDs according to an embodiment of the present disclosure.

Referring to FIG. 14, LEDs (230*a*, 230*b*, 230*c*, 230*d*) are installed on the wiring substrate 100 in a symmetrical arrangement. This installation structure may correspond to a state in which the LEDs shown in FIG. 6 are arranged in parallel.

As mentioned above, the LEDs (230*a*, 230*b*, 230*c*, 230*d*) may have asymmetric light distributions (a, b) with respect to the direction in which the first-type electrode 235 and the second-type electrode 237 are connected to each other. In addition, each of the LEDs (230*a*, 230*b*, 230*c*, 230*d*) may have asymmetric light distribution (a, b) (see FIG. 2) with respect to the direction in which the first electrode pad 132 and the second electrode pad 142 are connected to each other.

For example, the first LED 230*a* and the third LED 230*c* may have light distribution (a) that is biased to the left. This may correspond to the first arrangement. Additionally, the second LED 230*b* located between the first LED 230*a* and the third LED 230*c* may have light distribution (b) that is biased to the right. This structure may correspond to the second arrangement.

This structure may be a result of material characteristics of at least one of the substrate 231 and the semiconductor layer 232. For example, the above-described phenomenon may occur because the crystal structure of at least one of the substrate 231 and the semiconductor layer 232 has an inclined shape.

FIG. 14 shows a state in which each of the LEDs (230*a*, 230*b*, 230*c*, 230*d*) has an inclined crystal structure. In particular, considering a region (hereinafter, a first region) 230 where two adjacent pixels are paired, the first LED 230*a* of one pixel and the second LED 230*b* of the other pixel may have tilt angles that are symmetrical to each other. For example, the first LED 230*a* and the second LED 230*b* may be inclined in a direction away from each other. In addition, even in the second region 231 adjacent to the first region 230, the fourth LED 230*d* of the other pixel and the third LED 230*c* may have tilt angles that are symmetrical to each other.

Figure 15:
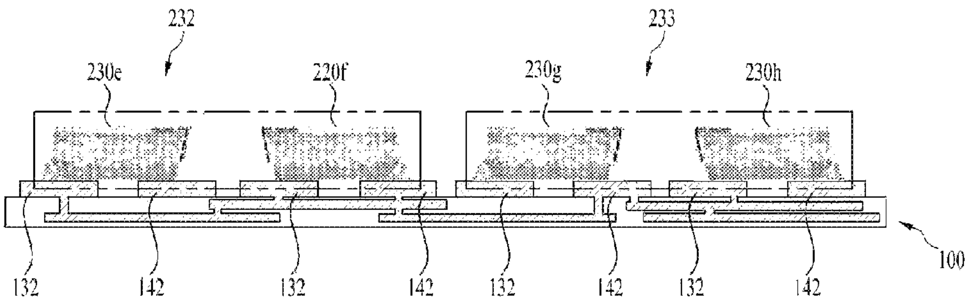
FIG. 15 is a schematic diagram illustrating another specific example of subpixel arrangement of a display device using LEDs according to an embodiment of the present disclosure.

FIG. 15 is a schematic diagram illustrating another specific example of subpixel arrangement of the display device using LEDs according to an embodiment of the present disclosure.

Referring to FIG. 15, light emitting diodes (230*e*, 230*f*, 230*g*, 230*h*) are symmetrically installed on the wiring substrate 100. This may correspond to a state in which the light emitting diodes (LEDs) shown in FIG. 6 are arranged in parallel.

As mentioned above, the light emitting diodes (230*e*, 230*f*, 230*g*, 230*h*) may have asymmetric light distribution (a, b) with respect to the direction along which the first-type electrode 235 and the second-type electrode 237 are connected to each other. In addition, each of the LEDs (230*e*, 230*f*, 230*g*, 230*h*) may have asymmetric light distribution (a, b; see FIG. 2) with respect to the direction along which the first electrode pad 132 and the second electrode pad 142 are connected to each other.

FIG. 15 shows a state in which each of the LEDs (230*e*, 230*f*, 230*g*, 230*h*) has an inclined crystal structure. In particular, considering a region (hereinafter, a third region) 232 where two adjacent pixels are paired, the fifth LED 230*e* of one pixel and the sixth LED 230*f* of the other pixel may have tilt angles that are symmetrical to each other. For example, the fifth LED 230*e* and the sixth LED 230*f* may be inclined in a direction toward which they approach each other. In addition, even in the fourth region 233 adjacent to the third region 232, the eighth LED 230*h* of the other pixel and the seventh LED 230*g* may have tilt angles that are symmetrical to each other.

Figure 16:
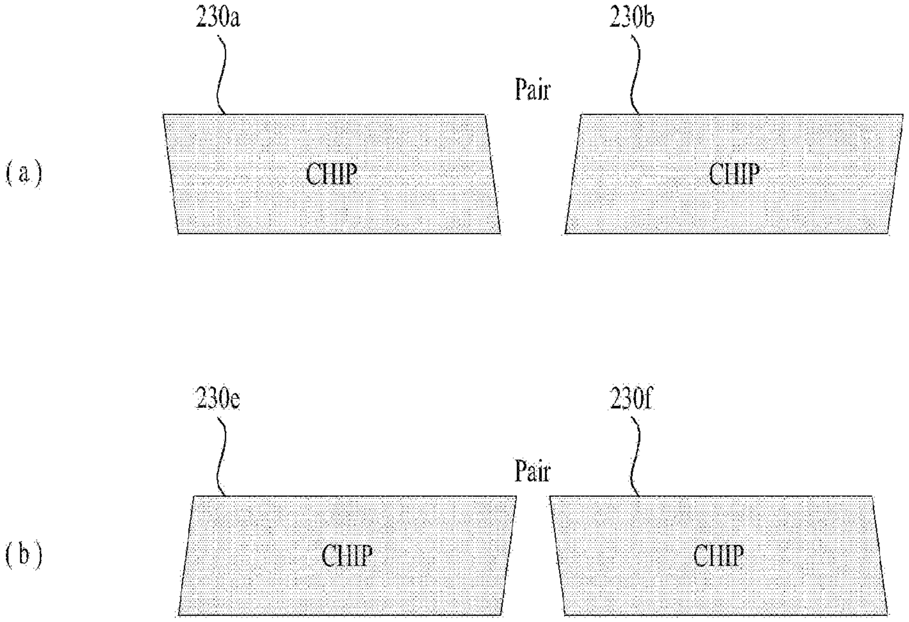
FIG. 16 is a schematic diagram illustrating an example of subpixel arrangement of FIGS. 14 and 15.

FIG. 16 is a schematic diagram illustrating an example of subpixel arrangement of FIGS. 14 and 15.

FIG. 16(*a*) schematically shows a state in which the first LED 230*a* and the second LED 230*b* (denoted by "Pair") are arranged to have inclined angles in a direction away from each other in the first region 230 of FIG. 14.

In addition, FIG. 16(*b*) schematically shows a state in which the fifth LED 230*e* and the sixth LED 230*f* (denoted by "Pair") in the third region 232 of FIG. 15 are arranged to have inclined angles in the direction toward which they approach each other.

As described above, when LEDs are symmetrically arranged in pairs with adjacent pixels, the biased light distributions (a, b) resulting from the crystal structure of the LEDs may offset from each other. In other words, the problem of colors appearing differently depending on the viewing direction when the display device is viewed from the outside can be solved.

Figure 17:
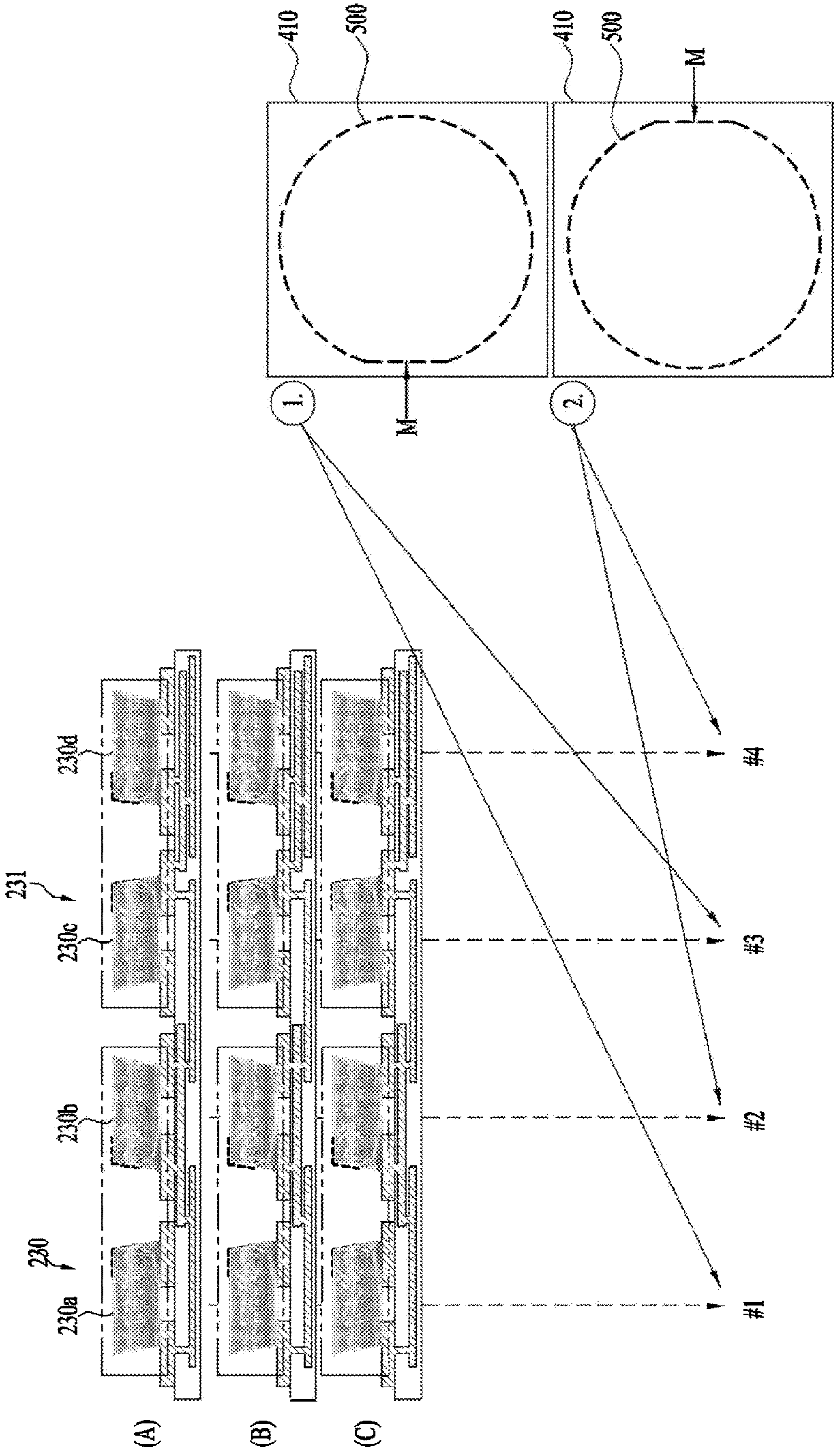
FIG. 17 is a schematic diagram illustrating a process of forming subpixel arrangement shown in FIG. 14.

FIG. 17 is a schematic diagram illustrating a process of forming subpixel arrangement shown in FIG. 14.

An example of a method of transferring light emitting diodes (LEDs) to have different arrangements will be briefly described with reference to FIG. 17.

For example, the LEDs (230*a*, 230*c*) are first transferred to odd columns of electrode pads (#1, #3, etc.) on the wiring substrate. Thereafter, the positions of the LEDs are rotated 180 degrees and then the LEDs (230*a*, 230*c*) are transferred to even columns of electrode pads (#2, #4, etc.) on the wiring substrate.

The LEDs (230*a*~230*d*) may be transferred to the wiring substrate after being transferred to the transfer substrate 410 while being located on the wafer 500. Here, the transfer substrate 410 may be, for example, a blue tape.

First, the LEDs (230*a*, 230*c*) may be transferred to the transfer substrate 410 in a state of the same arrangement as the upper side & (i.e., in a state in which the reference point M of the wafer 500 is located on the left).

Subsequently, the LEDs (230*a*, 230*c*) transferred to the transfer substrate 410 may be transferred to odd columns of electrode pads (#1, #3, etc.) of the wiring substrate.

Thereafter, in a state in which the wafer 500 is rotated 180 degrees as shown in & on the lower side (i.e., in a state in which the reference point M of the wafer 500 is located on the right), the LEDs (230*b*, 230*d*) may be transferred to the transfer substrate 410.

Subsequently, the LEDs (230*b*, 230*d*) transferred to the transfer substrate 410 may be transferred to electrode pads (#2, #4, etc.) of even columns of the wiring substrate.

Through the above-described process, the LEDs (230*a*~230*h*) arranged as shown in FIGS. 15 and 16 can be transferred onto the wiring substrate.

Figure 18:
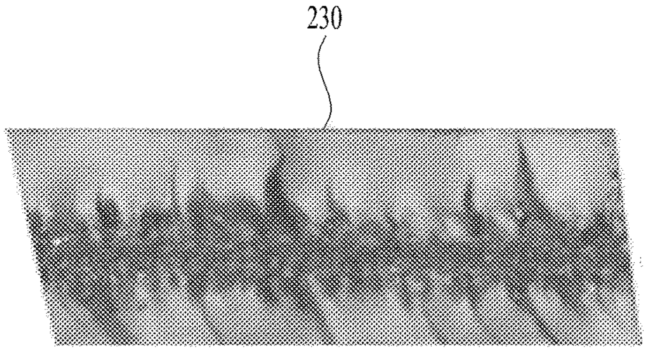
FIG. 18 is a side photo image illustrating each light emitting diode (LED) of a display device using LEDs according to an embodiment of the present disclosure.
Figure 19:
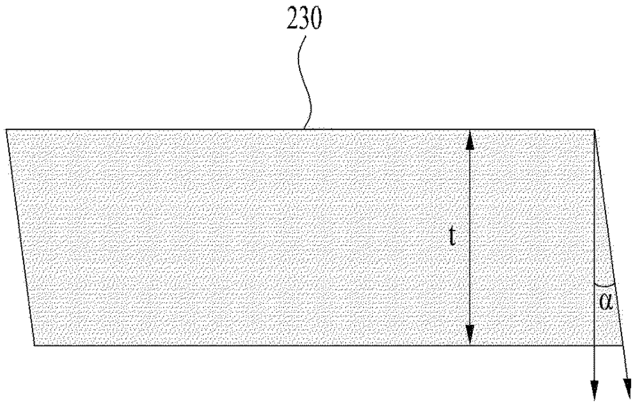
FIG. 19 is a schematic diagram illustrating a tilt angle of each light emitting diode (LED) of a display device using LEDs according to an embodiment of the present disclosure.

FIG. 18 is a side photo image illustrating each light emitting diode (LED) of the display device using LEDs according to an embodiment of the present disclosure. FIG. 19 is a schematic diagram illustrating a tilt angle of each light emitting diode (LED) of the display device using LEDs according to an embodiment of the present disclosure.

FIG. 18 is an enlarged photo image showing a side surface of the blue LED 230. FIG. 18 may represent a sapphire substrate that forms most of the thickness of the blue LED 230. As shown in FIG. 19, the tilt angle (a) of the blue LED 230 may be approximately 10 degrees. Additionally, as an example, the thickness (t) of the blue LED 230 may be 80 μm.

However, a gallium nitride semiconductor layer located on the sapphire substrate may also have the same or similar tilt angle. In some cases, the sapphire substrate may be removed after the light emitting diodes (LEDs) are manufactured. In this case, the gallium nitride-based semiconductor layer, rather than the substrate, of the light emitting diode (LED) may have the above tilt angle.

Figure 20:
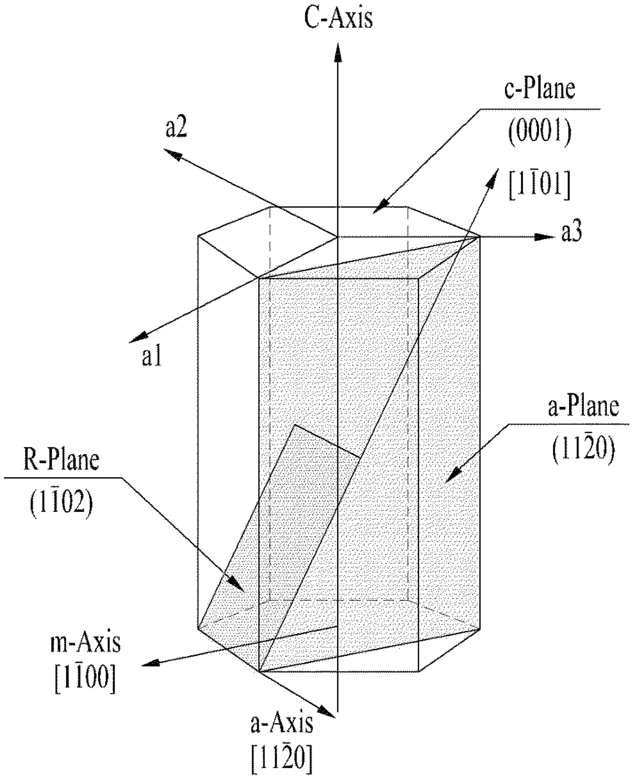
FIG. 20 is a view schematically illustrating sapphire crystal planes and sapphire crystal directions.

FIG. 20 is a view schematically illustrating sapphire crystal planes and sapphire crystal directions. Sapphire may be used as a growth substrate for LEDs made of gallium nitride-based semiconductors.

Referring to FIG. 20, sapphire has inclined crystal planes. For example, the R-plane may have a crystal plane inclined toward the m-axis. In general, sapphire may have the R-plane as its own growth plane. As shown in FIG. 20, since the R-plane has a tilted surface with respect to a hexagonal pillar crystal shape, the sapphire substrate and the gallium nitride-based semiconductor grown on the crystal plane of the sapphire substrate may have such an inclined tilt angle.

Additionally, such a tilt angle may also be formed due to cutting in the direction of the crystal plane of the sapphire substrate after the LED is formed with a gallium nitride-based semiconductor on the sapphire substrate, so that the above-described tilt angle can be formed.

Figure 21:
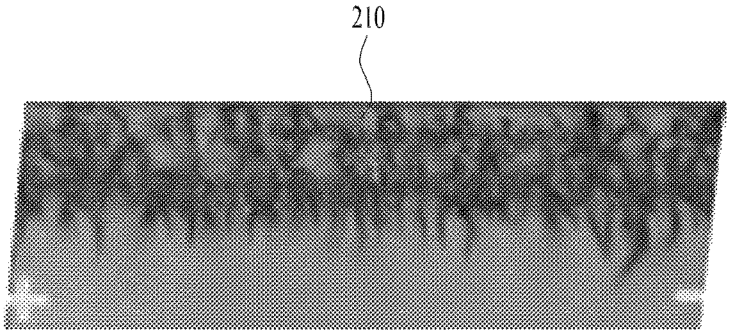
FIG. 21 is a view illustrating side photo images of light emitting diodes (LEDs) of a display device using LEDs according to an embodiment of the present disclosure.
Figure 21:
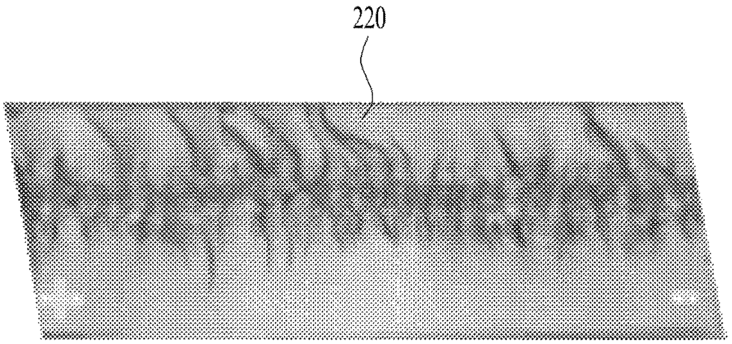
Figure 21:
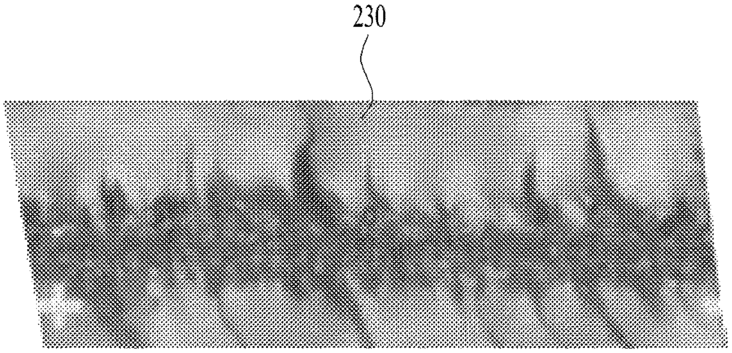
Figure 22:
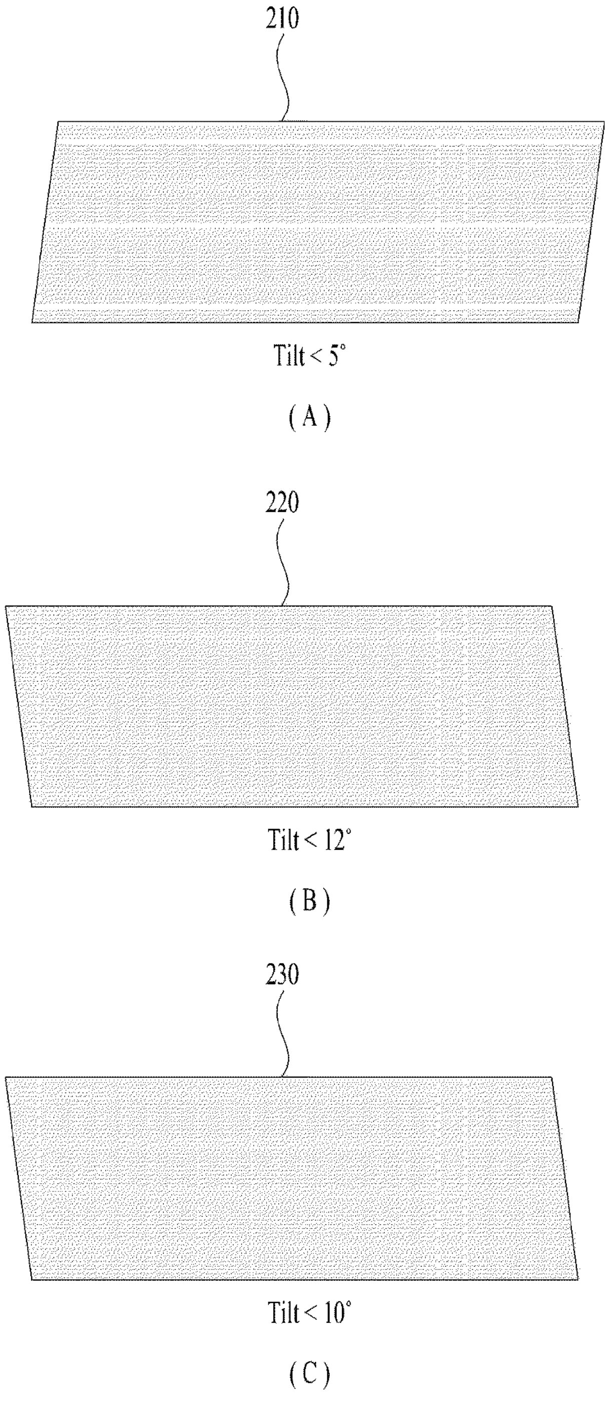
FIG. 22 is a schematic diagram illustrating tilt angles of light emitting diodes (LEDs) of a display device using LEDs according to an embodiment of the present disclosure.

FIG. 21 is a view illustrating side photo images of light emitting diodes (LEDs) of the display device using LEDs according to an embodiment of the present disclosure. FIG. 22 is a schematic diagram illustrating tilt angles of light emitting diodes (LEDs) of the display device using LEDs according to an embodiment of the present disclosure.

Referring to FIGS. 21 and 22, light emitting diodes (LEDs) that can be used in a display may have various tilt angles. For example, each of the LEDs shown in FIGS. 21(A) and 22(A) may have a tilt angle of 5 degrees or less in one direction.

In addition, each of the LEDs shown in FIGS. 21(B) and 22(B) may have a tilt angle of 12 degrees or less in a direction opposite to the tilt angle of the LEDs shown in FIGS. 21(A) and 22(A).

Additionally, the LEDs shown in FIGS. 21(C) and 22(C) may have a tilt angle of 10 degrees or less in the same direction as the tilt angle of the LEDs shown in FIGS. 21(B) and 22(B).

As described above, the LED may have a parallelogram structure with a side cross-section inclined to one side. As a result, the LED may have a light emitting pattern that is uneven and biased to one side with respect to the direction perpendicular to the side surface.

The above description is merely illustrative explanation of the technical idea of the present disclosure, and various modifications and variations will be possible to those skilled in the art without departing from the essential characteristics of the present disclosure.

Therefore, embodiments disclosed in the present disclosure are not intended to limit the technical idea of the present disclosure, but to describe, and the scope of the technical idea of the present disclosure is not limited by such embodiments.

The scope of protection of the present disclosure should be interpreted by the claims below, and all technical ideas within the scope equivalent thereto should be construed as being included in the scope of the present disclosure.

What is claimed is:

1. A display device using light emitting diodes comprising:
- a wiring substrate in which a plurality of unit pixels is defined;
- a first wiring electrode and a second wiring electrode arranged on the wiring substrate;
- a first electrode pad and a second electrode pad respectively connected to the first wiring electrode and the second wiring electrode; and
- at least one light emitting diode electrically connected to the first electrode pad and the second electrode pad in each unit pixel region to form a subpixel,
- wherein the light emitting diode includes:
  - a first light emitting diode disposed in a first pixel region and installed with a first arrangement; and
  - a second light emitting diode disposed in a second pixel region adjacent to the first pixel region and installed with a second arrangement that is symmetrical to the first arrangement, and
- wherein the second wiring electrode is disposed on the same layer as the light emitting diode.

2. The display device according to claim 1, wherein:
- the first wiring electrode is disposed on a different layer from the light emitting diode through at least one via hole connected to the first electrode pad.

3. The display device according to claim 2, wherein:
- the first electrode pad includes at least one pad extension portion.

4. The display device according to claim 3, wherein the pad extension portion includes:
- a first extension portion; and
- a second extension portion extending farther than the first extension portion.

5. The display device according to claim 3, wherein:
- the via hole is formed in the pad extension portion.

6. The display device according to claim 3, wherein:
- the pad extension portions are connected to each other in pixel regions adjacent to each other.

7. The display device according to claim 6, wherein:
- the pad extension portions are connected to each other in pixel regions facing each other.

8. The display device according to claim 7, wherein:
- for the pad extension portions connected to each other, the via hole is shared by the first pixel region and the second pixel region.

9. The display device according to claim 1, wherein:
- the first arrangement and the second arrangement are configured such that positions of electrodes of the first light emitting diode and the second light emitting diode are symmetrical to each other.

10. The display device according to claim 1, wherein:
- the second wiring device corresponding to the first pixel region and an adjacent second wiring electrode corresponding to the second pixel region are arranged symmetrically with respect to a central portion between the first pixel region and the second pixel region.

11. The display device according to claim 1, wherein:
- the first pixel region and the second pixel region are paired between the second wiring electrodes adjacent to each other.

12. The display device according to claim 1, wherein:
- the first light emitting diode and the second light emitting diode are configured to emit light of the same color.

13. The display device according to claim 1, wherein:
- a plurality of first pixel regions is arranged along the second wiring electrode.

14. The display device according to claim 13, wherein: the second wiring electrode is a common electrode commonly connected to the plurality of first pixel regions.

15. The display device according to claim 1, wherein: the first arrangement and the second arrangement are configured to offset an electric field generated from a difference in electrical polarity between the first light emitting diode and the second light emitting diode.

* * * * *